(12) United States Patent
Fan et al.

(10) Patent No.: US 7,405,165 B2
(45) Date of Patent: Jul. 29, 2008

(54) DUAL-TANK ETCH METHOD FOR OXIDE THICKNESS CONTROL

(75) Inventors: Yang Kai Fan, Hsin-Chu (TW); Yong Rong Chang, Hsin-Chu (TW); Yi Song Chiu, Hsin-Chu (TW); Ping Yin Shin, Hsin-Chu (TW)

(73) Assignee: Taiwan Semiconductor Manufacturing Co, Ltd, Hsin-chu (TW)

( * ) Notice: Subject to any disclaimer, the term of this patent is extended or adjusted under 35 U.S.C. 154(b) by 197 days.

(21) Appl. No.: 10/981,838

(22) Filed: Nov. 5, 2004

(65) Prior Publication Data

US 2006/0099818 A1 May 11, 2006

(51) Int. Cl.
*H01L 21/302* (2006.01)
*H01L 21/461* (2006.01)

(52) U.S. Cl. ............... 438/749; 438/750; 257/E21.249; 257/E21.309; 216/99

(58) Field of Classification Search .................. 438/749, 438/750, 751; 257/E21.249, E21.251, E21.309; 216/99, 103
See application file for complete search history.

(56) References Cited

U.S. PATENT DOCUMENTS

| | | | | |
|---|---|---|---|---|
| 5,960,297 | A * | 9/1999 | Saki ........................... | 438/424 |
| 6,245,681 | B1 * | 6/2001 | Shields ....................... | 438/694 |
| 6,326,313 | B1 * | 12/2001 | Couteau et al. ............. | 438/745 |
| 2005/0028932 | A1 * | 2/2005 | Shekel et al. ........... | 156/345.15 |

* cited by examiner

*Primary Examiner*—Caridad M Everhart
(74) *Attorney, Agent, or Firm*—Tung & Associates

(57) ABSTRACT

A dual-tank etch method which is suitable for the stripping of a silicon nitride layer from a pad oxide layer provided on a substrate, and etching of the pad oxide layer to a desired target thickness, is disclosed. The method includes providing a first processing tank containing a silicon nitride-stripping chemical; stripping the silicon nitride layer from the pad oxide layer by placing the substrate in the first processing tank; providing a second processing tank containing an oxide-etching chemical; and etching the pad oxide layer to the desired target thickness by placing the substrate in the second processing tank. By carrying out the pad oxide-etching step and the silicon nitride-stripping step in separate processing tanks, accumulation of silicon oxide precipitates in the second processing tank is avoided.

17 Claims, 3 Drawing Sheets

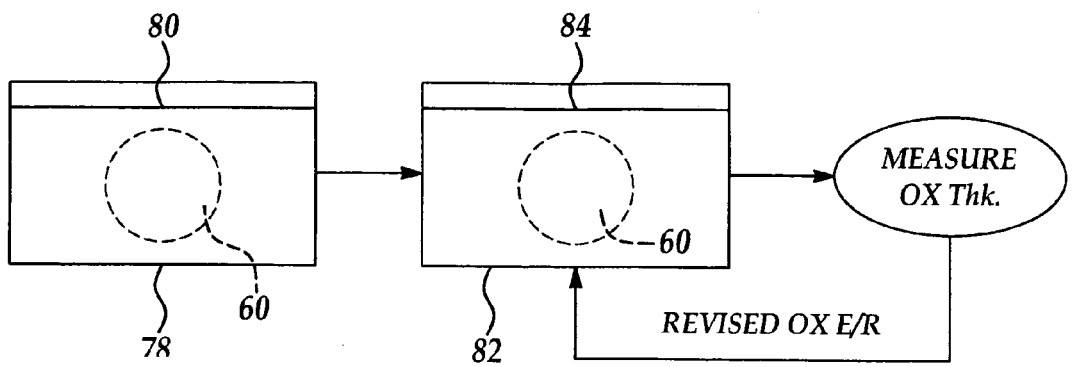
*Figure 4*
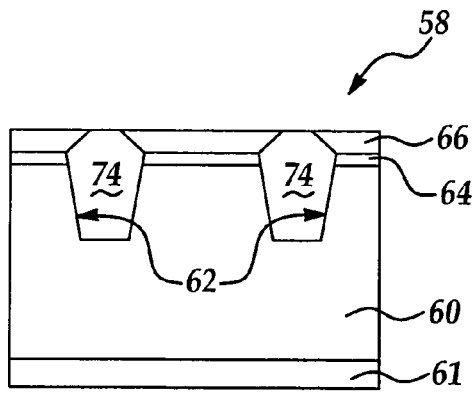
*Figure 5A*
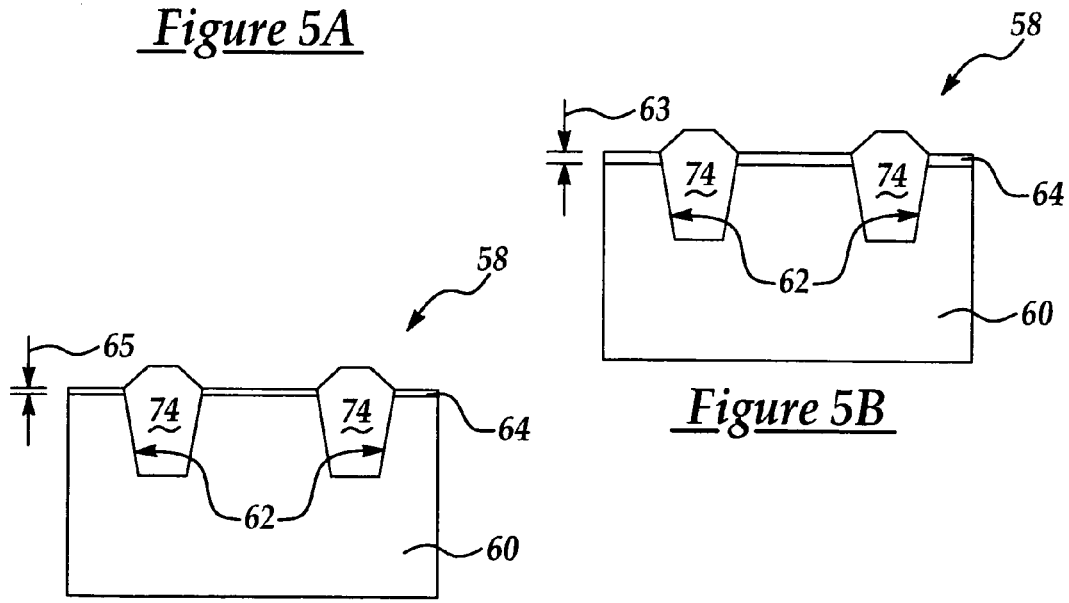
*Figure 5B*
*Figure 5C*

DUAL-TANK ETCH METHOD FOR OXIDE THICKNESS CONTROL

FIELD OF THE INVENTION

The present invention relates to wet etch processes for etching silicon nitride and silicon oxide layers on semiconductor wafer substrates. More particularly, the present invention relates to a dual-tank etch method in which a silicon nitride layer and a pad oxide layer are etched in separate tanks to facilitate precise etching of the pad oxide layer to within a narrow target thickness range.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include sequential deposition of conductive and insulative layers on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove material from one or more conducting layers from the areas not covered by the mask, thereby etching the conducting layer or layers in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. Additional techniques, such as dual damascene processes, are used to form conductive vias which establish electrical contact between vertically-spaced conductive lines or layers in the circuits. The finished semiconductor product includes microelectronic devices including transistors, capacitors and resistors that form the integrated circuits on each of multiple die on a single wafer.

In the semiconductor industry, CMOS (complementary metal-oxide semiconductor) technology is extensively used in the fabrication of IC devices. CMOS technology typically involves the use of overlying layers of semiconductor material with the bottom layer being a dielectric layer and the top layer being a layer of doped silicon material that serves as a low-resistivity electrical contact gate electrode. The gate electrode, also referred to as a gate stack, typically overlies the dielectric layer.

In the semiconductor fabrication industry, silicon oxide ($SiO_2$) is frequently used for its insulating properties as a gate oxide or dielectric. As the dimensions of device circuits on substrates become increasingly smaller, the gate dielectric thickness must decrease proportionately in field effect transistors (FETs) to approximately 3 to 3.5 nonometers. Accordingly, device performance and reliability can be adversely affected by such factors as interfacial defects, defect precursors and diffusion of dopants through gate dielectrics, as well as unintended variations in thickness in the gate oxide layer among central and peripheral regions of the layer.

Two types of CMOS device structures which are commonly fabricated in semiconductor technology include the MOSCAP (metal oxide semiconductor capacitor) structure and the MOSFET (metal oxide semiconductor field effect transistor) structure. Both of these structures include a substrate on which is deposited a dielectric layer having a high dielectric constant (k), such as a pad oxide layer. A silicon-containing gate, or gate stack, is deposited on the dielectric layer and connects a pair of trench oxide layers (in the case of a MOSCAP structure) or source and drain regions (in the case of a MOSFET structure).

FIG. 1 is a cross-section of an example of a polysilicon gate 20 formed between a source 16 and a drain 18 of a device 30 on a semiconductor wafer substrate 10. An STI (shallow trench isolation) structure 32 includes a shallow trench 12 filled with trench oxide 14 and separates devices from each other on the wafer substrate 10. A polysilicon silicide, or polycide 22, typically composed of nickel or cobalt, is deposited on the polysilicon gate 20, and an insulating layer 28 is deposited on the polycide 22. A source silicide 24 is deposited on the source 16, and a drain silicide 26 is deposited on the drain 18.

As shown in FIG. 2, an STI structure 36 is fabricated by initially depositing a pad oxide layer 42 on a silicon substrate 40 and a silicon nitride layer 44 on the pad oxide layer 42. One or more trenches 38 is etched through the silicon nitride layer 44 and the pad oxide layer 42, into the substrate 40. A liner oxide layer 46 is then deposited on the sidewalls and bottom of the trench or trenches 38. After a liner densification step, each trench 38 is filled with a trench oxide 48, followed by chemical mechanical planarization of the oxide layer 50 above the trench oxides 48. During the CMP step, the silicon nitride layer 44 serves as a polish-stop material to prevent over-polishing of the STI structure 36.

In a subsequent silicon nitride etching step, the silicon nitride layer 44 is then etched or stripped from the underlying pad oxide layer 42. This is accomplished typically by dipping the wafer substrate 40 into a wet bench tank that contains hot phosphoric acid ($H_3PO_4$). In a subsequent pad oxide etching step, the pad oxide layer 42 is etched to a desired target thickness.

The silicon nitride etching step and the pad oxide etching step are typically both carried out in the same wet bench tank that contains hot phosphoric acid. During the silicon nitride etching step, silicon oxide (SiO) is generated as a reaction by-product and accumulates in the wet bench tank. Accordingly, as a lot of successive wafers is processed, the quantity of silicon oxide which accumulates in the tank increases with the run number of the lot. The level of silicon oxide in the tank eventually reaches a saturation point (120 ppm).

One of the problems associated with the conventional method of etching the silicon nitride layer and the pad oxide layer in the same wet bench etch tank is that the etch rate for the pad oxide layer is indirectly proportional to the quantity or concentration of silicon oxide precipitates in the tank. Because the quantity of silicon oxide in the tank increases as the process run number increases, the pad oxide layer for wafers in the higher run number range cannot be etched to within the desired target thickness. Thus, the number of runs in a processing sequence must normally be restricted in order to attain precise control of the pad oxide layer thickness.

Placing a restriction on the number of runs in a processing sequence, however, has limitations, since the variation in pad oxide layer thickness among wafers in such a sequence can vary by as much as 40 angstroms (typically about 70~110 angstroms). Furthermore, the silicon oxide precipitates form quickly in the processing tank and have a tendency to become attached to the wafer surface. This induces surface defects in the devices being fabricated on the wafers. Accordingly, a novel method is needed for the etching of a silicon nitride layer from a pad oxide layer and etching of the pad oxide layer to a desired target thickness, such as during the fabrication of STI structures on semiconductor wafers, while eliminating or substantially reducing the formation of silicon oxide precipitates in the oxide-etching medium.

An object of the present invention is to provide a novel method for etching an oxide layer to a selected target thickness.

Another object of the present invention is to provide a novel method for stripping a silicon nitride layer from a pad oxide layer and etching the pad oxide layer to a selected target thickness.

Yet another object of the present invention is to provide a novel method in which a silicon nitride layer is stripped from a pad oxide layer and the pad oxide layer is etched to a selected target thickness in separate processing tanks.

Still another object of the present invention is to provide a novel method which is capable of achieving a thickness for a pad oxide layer to within about 5 angstroms of a target thickness for the layer.

Yet another object of the present invention is to provide a novel method which prevents or substantially reduces the accumulation of silicon oxide precipitates in a processing tank in which the etching of a pad oxide layer to a selected target thickness is carried out.

A still further object of the present invention is to provide a novel dual-tank etch method which is suitable for any process in which it is necessary to strip a silicon nitride layer from a pad oxide layer and etch the pad oxide layer to a selected target thickness, including but not limited to the fabrication of shallow trench isolation (STI) structures.

Another object of the present invention is to provide a novel dual-tank etch method which eliminates or substantially reduces the formation of defects on wafers caused by silicon oxide precipitates in an etchant medium.

SUMMARY OF THE INVENTION

In accordance with these and other objects and advantages, the present invention is generally directed to a novel dual-tank etch method which is suitable for the stripping of a silicon nitride layer from a pad oxide layer provided on a substrate, and etching of the pad oxide layer to a desired target thickness. The method includes providing a first processing tank containing a silicon nitride-stripping chemical; stripping the silicon nitride layer from the pad oxide layer by placing the substrate in the first processing tank; providing a second processing tank containing an oxide-etching chemical; and etching the pad oxide layer to the desired target thickness by placing the substrate in the second processing tank. By carrying out the pad oxide-etching step and the silicon nitride-stripping step in separate processing tanks, accumulation of silicon oxide precipitates in the second processing tank is avoided.

The processing time required for the oxide-etching step can be determined by initially determining the etch rate for the oxide layer, such as by using a pilot wafer or wafers, for example, and then adjusting the etch time accordingly for each of multiple successive wafers in a lot. Alternatively, the processing time may be determined by establishing a correlation curve in which the oxide etch rate is correlated with the run number of wafers in the lot.

BRIEF DESCRIPTION OF THE DRAWINGS

The invention will now be described, by way of example, with reference to the accompanying drawings, in which:

FIG. 4 is a schematic of first and second processing tanks in implementation of the method of the present invention;

FIGS. 5A-5C are cross-sectional views of the STI structure of FIG. 3, illustrating sequential stripping of a silicon nitride layer from an underlying pad oxide layer and etching of the pad oxide layer to a selected target thickness according to the method of the present invention.

DETAILED DESCRIPTION OF THE INVENTION

Figure 1:
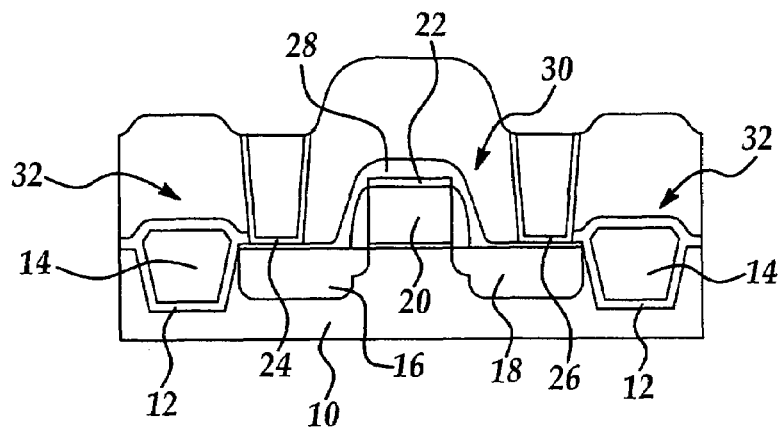
FIG. 1 is a cross-section of a semiconductor device fabricated on a substrate, with STI structures separating the device from adjacent devices (not shown)
Figure 2:
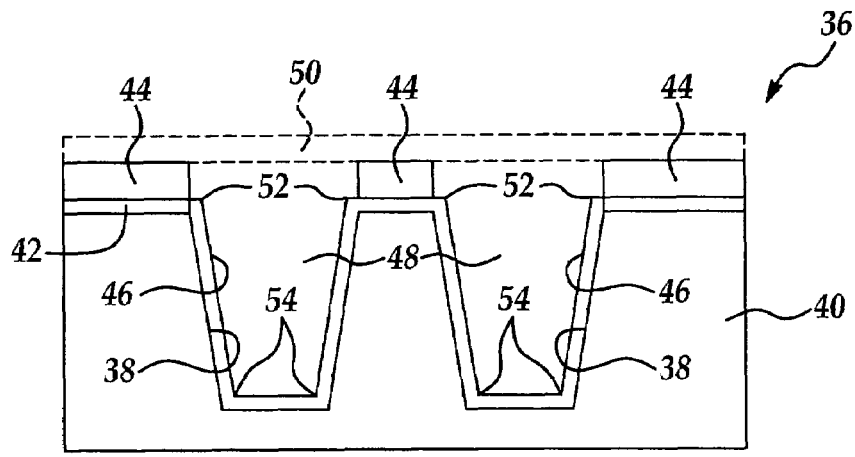
FIG. 2 is a cross-section of a conventional STI structure.

The present invention is effective in the stripping of a silicon nitride layer from an underlying pad oxide layer and etching of the pad oxide layer to a target thickness, particularly in the fabrication of shallow trench isolation (STI) structures used to separate adjacent IC devices from each other on a semiconductor wafer substrate. However, while references may be made herein to such STI structures, it is understood that the present invention is equally applicable to any process in semiconductor fabrication in which it is necessary to strip a silicon nitride layer from an underlying pad oxide layer and etch the pad oxide layer to a selected target thickness.

The present invention contemplates a novel dual-tank etch method which is suitable for the stripping of a silicon nitride layer from a pad oxide layer and etching of the pad oxide layer to a desired target thickness in the fabrication of integrated circuits on a semiconductor wafer substrate. According to the method, the silicon nitride layer is first stripped from the underlying pad oxide layer in a first processing tank. The first processing tank contains a silicon nitride-stripping chemical, such as phosphoric acid ($H_3PO_4$). Next, the pad oxide layer is etched to a selected target thickness in a second processing tank, which contains an oxide-etching liquid etchant such as phosphoric acid.

Because all or most of the silicon nitride layer is stripped from the pad oxide layer in the first processing tank, the nitride-stripping chemical in the first processing tank eventually becomes saturated with silicon oxide precipitate by-product as the run number of multiple successive wafers processed in a lot increases. On the other hand, all or most of the silicon nitride has been stripped from the pad oxide layer upon commencement of the oxide-etching step carried out in the second processing tank. Accordingly, significant accumulation of silicon oxide precipitates in the liquid etchant of the second processing tank is avoided.

Because the etch rate of an oxide layer in a liquid etchant decreases with the quantity or concentration of silicon oxide precipitates in the etchant, precise control over the intended thickness of the pad oxide layer can be achieved in the second processing tank. Thus, the pad oxide layer can be etched to a thickness which is within typically about 5 angstroms of the target thickness for the layer. Furthermore, etching of the pad oxide layer in an etchant which is substantially devoid of silicon oxide precipitates eliminates or at least minimizes silicon oxide contamination of devices being fabricated on the substrate.

The processing time which is required to etch the pad oxide layer to the selected target thickness in the second processing tank can be calculated by initially determining the etch rate for the oxide layer. This can be carried out by etching an oxide layer of comparable thickness on a pilot wafer or on each of multiple pilot wafers, for example, to obtain an etch time or average etch time, respectively, which is required to etch a particular quantity of oxide from the layer; and determining the etch rate of the oxide layer by dividing the thickness of oxide etched from the layer by the etch time. The processing time is then determined by multiplying the calculated etch rate by the maximum thickness of oxide to be removed from the pad oxide layer. This processing time is used to subsequently etch the pad oxide layer on each of the multiple successive wafers in a production wafer lot from a pre-etch thickness to a target thickness.

Small quantities of silicon oxide precipitate may slowly accumulate over time in the liquid etchant of the second processing tank. These silicon oxide precipitate particles tend to inhibit the oxide etch rate. If analysis of the thickness of the etched pad oxide layer on each wafer reveals that the etch rate for the pad oxide layer is decreasing with each successive run number in the lot, then the processing time for etching of the pad oxide layer on each of the remaining wafers in the wafer lot can be modified accordingly in order to most closely obtain the target thickness of the pad oxide layer on those wafers.

The processing time required to etch the pad oxide layer on each wafer may alternatively be determined by first establishing a correlation curve in which the oxide etch rate is correlated with the run number of the wafers in the lot. The processing time for each run number can then be calculated by multiplying the etch rate for the corresponding run number by the maximum thickness of oxide to be removed (which equals the difference between the thickness of the pre-etched oxide layer and the target thickness). Each calculated processing time is then used to etch the oxide layer for the corresponding run number of the multiple successive wafers.

Figure 3:
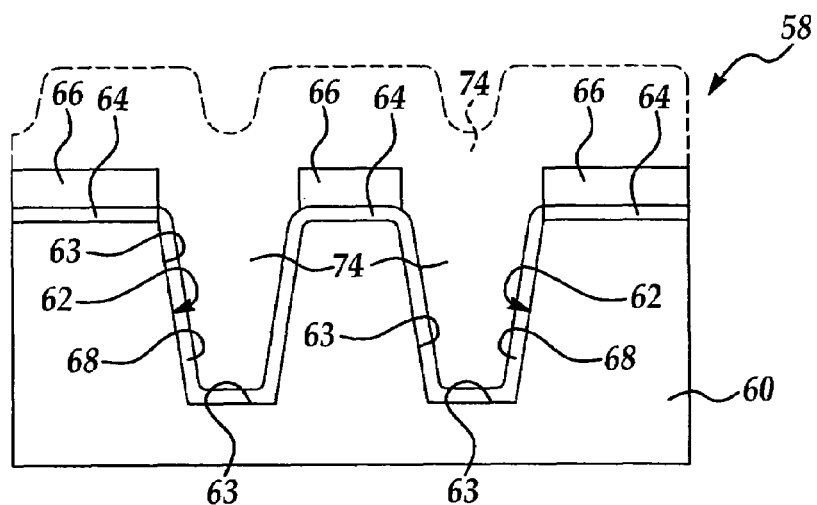
FIG. 3 is a cross-section of an STI structure partially fabricated preparatory to implementation of the method of the present invention.

Referring to FIG. 3, an STI structure 58 fabricated preparatory to implementation of the method of the present invention is shown. The STI structure 58 includes one or multiple trenches 62 provided in a typically silicon substrate 60, which may have a backside silicon nitride layer 61. A pad oxide layer 64, typically silicon dioxide ($SiO_2$), and a silicon nitride (SiN) layer 66 are sequentially provided on the substrate 60. A liner oxide layer 68 lines the side and bottom surfaces 63 of each trench 62. A trench oxide 74 fills each trench 62. The trench-formation step can be carried out using conventional photolithography and etching techniques. Furthermore, the trench depth, angles and corner exposure can be tuned depending on the particular application, according to the knowledge of those skilled in the art.

The trench oxide 74 is deposited in the trenches 62 either in diffusion, using an LPCVD furnace, or in thin films using a CVD system. Following an optional post-annealing step, a CMP step is carried out. At the CMP step, the trench oxide 74 is subjected to chemical mechanical planarization (CMP) to remove excess oxide and planarize the trench oxide 74, as is known by those skilled in the art. During CMP, the silicon nitride layer 66 serves as a polish-stop layer to prevent damage to the underlying device features being fabricated on the substrate 60.

Referring next to FIG. 4 and FIGS. 5A-5C, the method of the present invention is implemented typically in a two-step etch process following chemical mechanical planarization of the trench oxide 74. As shown in FIG. 5A, after the CMP step, the STI structure 58 includes the pad oxide layer 64 on the substrate 60 and the silicon nitride layer 66 on the pad oxide layer 64. The backside silicon nitride layer 61 typically remains on the backside of the substrate 60.

In a first step of the invention, the silicon nitride layer 66 is stripped from the underlying pad oxide layer 64. Simultaneously, the backside silicon nitride layer 61 is typically stripped from the backside of the substrate 60. In a second step, the pad oxide layer 64 is etched from a pre-etch thickness 63 (FIG. 5B) down to a selected target thickness 65 (FIG. 5C). The difference between the pre-etch thickness 63 and the target thickness 65 is preferably no greater than about 5 angstroms.

The first step, in which the silicon nitride layer 66 is stripped from the underlying pad oxide layer 64 and the backside silicon nitride layer 61 is stripped from the backside of the wafer substrate 60, is carried out by placing the substrate 60 in a first wet bench processing tank 78 containing a supply of nitride strip chemical 80, as shown in FIG. 4. Preferably, the nitride strip chemical 80 is phosphoric acid ($H_3PO_4$). The phosphoric acid is present in the first processing tank 78 in a concentration of typically about 86%. During the silicon nitride-stripping step, the nitride strip chemical 80 is maintained at a temperature of typically about 160 degrees C.

The processing time required for the silicon nitride stripping step in the first processing tank 78 is based on the thickness of silicon nitride to be stripped from the underlying pad oxide layer 64 and the silicon nitride etch rate. Accordingly, the thickness of silicon nitride, in angstroms, which is to be stripped from the pad oxide layer 64 is multiplied by the silicon nitride etch rate, in angstroms/minute. This value is converted into seconds to obtain the processing time for the silicon nitride stripping step, in seconds. Preferably, a 50% over-etch is included in the processing time to ensure complete removal of the silicon nitride layer 66 from the underlying pad oxide layer 64.

As an example, if the etch rate of silicon nitride for the stripping of the silicon nitride layer 66 from the pad oxide layer 64 in $H_3PO_4$ is found to be 60 angstroms/minute, this corresponds to an etch rate of 1 angstrom/second. If the thickness of silicon nitride to be stripped from the underlying pad oxide layer 64 is 1,600 angstroms, then the processing time required to remove the silicon nitride from the pad oxide layer 64 is 1,600 seconds. Inclusion of a 50% over-etch into the processing time would result in a final processing time of 2,400 seconds (1,600*1.5=2,400 seconds).

Upon completion of the silicon nitride stripping step, the substrate 60 is removed from the first processing tank 78. The nitride strip chemical 80 eventually becomes saturated with silicon dioxide ($SiO_2$), which forms in the nitride strip chemical 80 during the silicon nitride stripping step. In the second step, the substrate 60 is placed in a second wet bench processing tank 82, in which the pad oxide layer 64 is etched from the pre-etch thickness 63 of FIG. 55B to the target thickness 65 of FIG. 5C. The second processing tank 82 contains a supply off liquid oxide etchant 84. Preferably, the liquid oxide etchant 84 is phosphoric acid ($H_3PO_4$). The phosphoric acid is present in the second processing tank 82 in a concentration of typically about 86%. During the oxide-etching step, the liquid oxide etchant 84 is maintained at a temperature of typically about 160 degrees C in the second processing tank 82.

The processing time for the oxide-etching step is based on the maximum thickness of oxide to be etched from the pad oxide layer 64 and the oxide etch rate. Accordingly, the maximum thickness of oxide, in angstroms, to be stripped from the pad oxide layer 64 is multiplied by the oxide etch rate, in angstroms/minute. This value is converted into seconds to obtain the processing time for the oxide etching step, in seconds.

For example, the etch rate of oxide for the etching of oxide from the pad oxide layer 64 in $H_3PO_4$ may be 2 angstroms/minute. The pre-etch thickness 63 of the pad oxide layer 64 is assumed to be 100 angstroms, for example. If the maximum thickness of oxide to be etched from the pad oxide layer 64 is to be 5 angstroms, for a target thickness 65 of no greater than 95 angstroms, then the processing time required to remove the oxide from the pad oxide layer 64 must be no greater than 2.5 minutes (5 divided by 2=2.5). This translates into a processing time of 150 seconds (2.5*60=150 seconds).

As further shown in FIG. 4, the final thickness of the pad oxide layer 64 (FIG. 5C) on each of multiple successive wafers 60 in a production wafer lot, after the oxide-etching step, can be measured and compared to the target thickness 65 (FIG. 5C) for the pad oxide layer 64. If such a comparison reveals that the etch rate for the pad oxide layer 64 is decreasing with each successive run number in the lot (as may result from an accumulation of silicon oxide precipitates in the second processing tank 82), then the processing time for etching of the pad oxide layer 64 on each of the remaining wafers in the wafer lot can be modified in order to most closely obtain the target thickness 65 of the pad oxide layer 64 on those wafers.

As noted herein above, a correlation curve (not shown) may be established in which the oxide etch rate is correlated with each run number of the wafers in the lot, typically using a pilot wafer lot having a corresponding number of pilot wafers. The processing time for each run number is then calculated by multiplying the etch rate for the corresponding run number by the maximum thickness of oxide to be removed from the pad oxide layer on the production wafers. Each calculated processing time is then used to etch the oxide layer for the corresponding run number of the multiple successive wafers.

Figure 6:
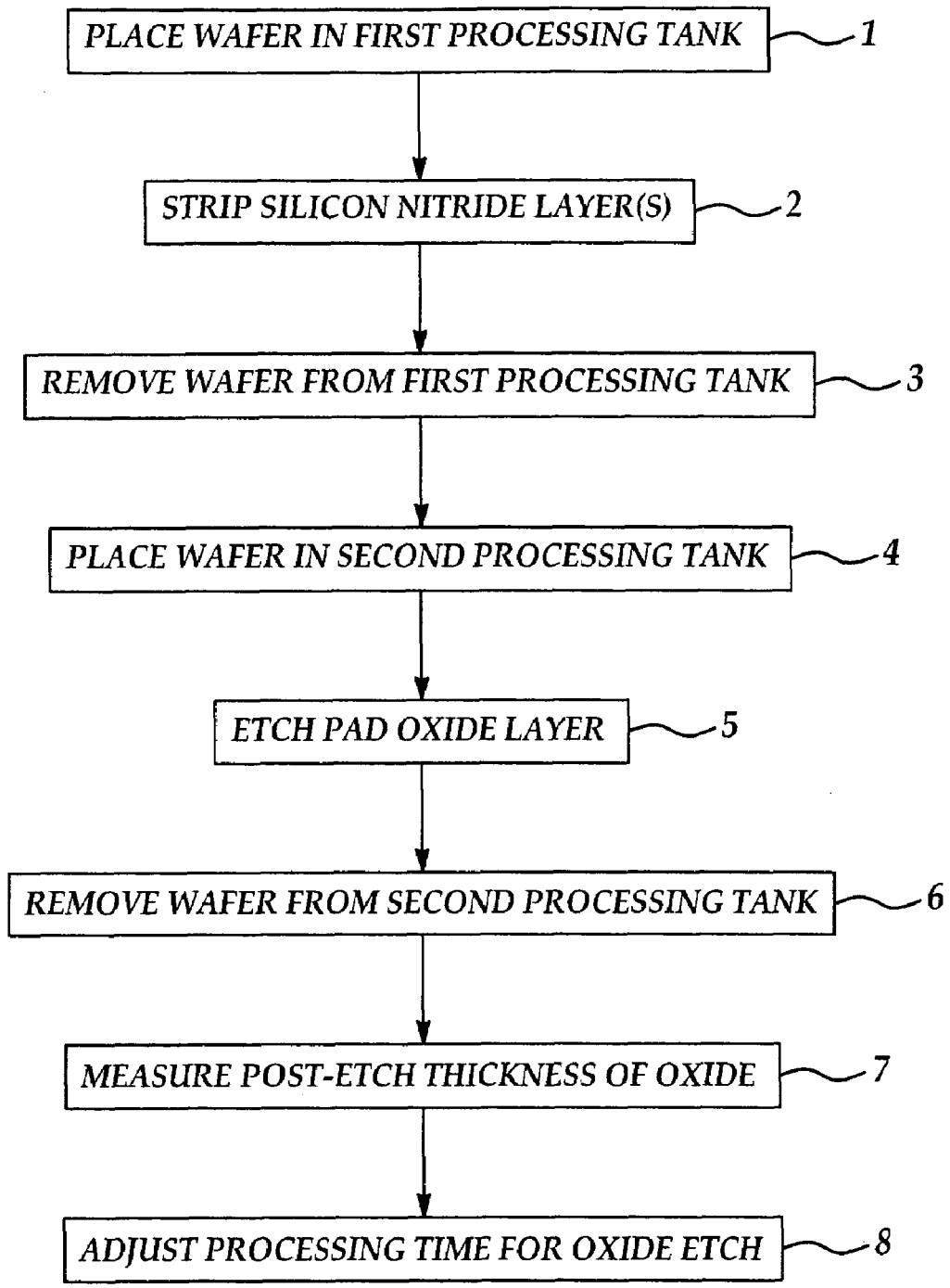
FIG. 6 is a flow diagram which summarizes sequential process steps according to the method of the present invention.

A typical sequence of process steps according to the method of the present invention is shown in FIG. 6. In step 1, the wafer is placed in a first processing tank which contains a silicon nitride stripping chemical, such as phosphoric acid. In step 2, a silicon nitride layer is stripped from an underlying pad oxide layer on the wafer. A backside silicon nitride layer may be simultaneously stripped from the backside of the wafer. In step 3, the wafer is removed from the first processing tank. In step 4, the wafer is placed in a second processing tank containing an oxide etchant liquid, such as phosphoric acid. In step 5, the pad oxide layer is etched from a pre-etch thickness to a selected target thickness. In step 6, the wafer is removed from the second processing tank. In step 7, the post-etch thickness of the pad oxide layer is measured and compared to the target thickness. In step 8, the processing time of each of the successive wafers in a production wafer lot is adjusted according to the difference between the post-etch thickness and the target thickness to compensate for an increased oxide etch rate, as needed.

While the preferred embodiments of the invention have been described above, it will be recognized and understood that various modifications can be made in the invention and the appended claims are intended to cover all such modifications which may fall within the spirit and scope of the invention.

What is claimed is:

1. A method of controlling thickness of an oxide layer, comprising the steps of:
    providing a substrate having a pad oxide layer and a nitride layer on and overlying said oxide layer;
    providing a first phosphoric acid saturated with oxide;
    providing a second phosphoric acid;
    stripping to remove said nitride layer from said underlying pad oxide layer by immersing said substrate in said first phosphoric acid;
    removing said substrate from said first phosphoric acid; and
    etching said pad oxide layer to a target thickness by immersing said substrate in said second phosphoric acid for a processing time, said pad oxide layer etched following removal of said silicon nitride layer.

2. The method of claim 1 further comprising the steps of measuring a post-etch thickness of said pad oxide layer, comparing said post-etch thickness to said target thickness and prolonging said second processing time when said post-etch thickness is greater than said target thickness.

3. The method of claim 1, wherein the first and second phosphoric acid are at about the same temperature.

4. A method of controlling thickness of a pad oxide layer comprising:
    providing a plurality of substrates each having a pad oxide layer underlying a nitride layer;
    providing a nitride strip chemical saturated with oxide;
    providing an oxide etchant separate from said nitride strip chemical;
    stripping to remove said nitride layer from said underlying pad oxide layer by immersing said substrates in said nitride strip chemical;
    removing said substrates from said nitride strip chemical;
    etching said pad oxide layer to a target thickness by immersing said substrates in said oxide etchant for a processing time, said pad oxide layer etched following removal of said silicon nitride layer;
    measuring a post-etch thickness of said pad oxide layer on each of said substrates;
    comparing said post-etch thickness to said target thickness; and
    prolonging said processing time of remaining successive ones of said substrates in said substrate lot when said post-etch thickness is greater than said target thickness.

5. The method of claim 4 wherein said nitride strip chemical comprises phosphoric acid.

6. The method of claim 4, wherein the first and second phosphoric acid are at about the same temperature.

7. The method of claim 4 wherein said oxide etchant comprises phosphoric acid.

8. The method of claim 7 wherein said nitride strip chemical comprises phosphoric acid.

9. The method of claim 4 further comprising the steps of:
    providing a correlation curve wherein etch rates of said successive ones of said plurality of substrates, respectively, are correlated with lot numbers of said successive ones of said plurality of substrates, respectively, in said substrate lot; and
    adjusting said second processing time for said successive ones of said plurality of substrates, respectively, according to said etch rates, respectively, to achieve said target thickness for said post-etch thickness on said successive ones of said plurality of substrates, respectively.

10. The method of claim 7 wherein said nitride strip chemical comprises phosphoric acid.

11. The method of claim 7 wherein said oxide etchant comprises phosphoric acid.

12. The method of claim 11 wherein said nitride strip chemical comprises phosphoric acid.

13. A method of preventing surface defects induced by silicon oxide precipitates on a substrate in a processing tank, comprising the steps of:
- providing a substrate having a pad oxide layer and a silicon nitride layer on and overlying said pad oxide layer;
- providing a nitride strip chemical saturated with oxide in a first processing tank;
- providing an oxide etchant in a second processing tank;
- stripping to remove said nitride layer from said underlying pad oxide layer by immersing said substrates in said nitride strip chemical;
- removing said substrate from said first processing tank; and
- etching said pad oxide layer to a target thickness by immersing said substrate in said oxide etchant for a processing time, said pad oxide layer etched following removal of said silicon nitride layer.

14. The method of claim 13 wherein said nitride strip chemical comprises phosphoric acid.

15. The method of claim 13 wherein said oxide etchant comprises phosphoric acid.

16. The method of claim 13 further comprising the steps of measuring a post-etch thickness of said pad oxide layer, comparing said post-etch thickness to said target thickness and prolonging said second processing time when said post-etch thickness is greater than said target thickness.

17. The method of claim 13, wherein the first and second phosphoric acid are at about the same temperature.

* * * * *